United States Patent
Kloster et al.

(10) Patent No.: US 7,560,165 B2
(45) Date of Patent: Jul. 14, 2009

(54) SEALING POROUS DIELECTRIC MATERIALS

(75) Inventors: Grant Kloster, Lake Oswego, OR (US); Robert P. Meagley, Hillsboro, OR (US); Michael D. Goodner, Hillsboro, OR (US); Kevin P. O'brien, Portland, OR (US); Don Bruner, Livermore, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 11/147,909

(22) Filed: Jun. 7, 2005

(65) Prior Publication Data

US 2005/0227094 A1 Oct. 13, 2005

Related U.S. Application Data

(62) Division of application No. 10/735,122, filed on Dec. 12, 2003.

(51) Int. Cl.
*B32B 9/04* (2006.01)
*B32B 3/26* (2006.01)

(52) U.S. Cl. .................. 428/447; 428/304.4; 428/315.5

(58) Field of Classification Search .............. 428/304.4, 428/315.5, 319; 427/304.4, 315.5, 319.3, 427/447

See application file for complete search history.

(56) References Cited

U.S. PATENT DOCUMENTS

| | | | |
|---|---|---|---|
| 5,907,382 A * | 5/1999 | Kajiura et al. .............. 349/158 |
| 6,245,507 B1 * | 6/2001 | Bogdanov ....................... 435/6 |
| 6,500,770 B1 * | 12/2002 | Cheng et al. ................. 438/782 |
| 6,734,094 B2 | 5/2004 | Kloster et al. ................ 438/619 |
| 6,833,320 B2 | 12/2004 | Meagley et al. ............. 438/640 |
| 6,858,528 B2 | 2/2005 | Meagley et al. ............. 438/629 |
| 6,861,332 B2 | 3/2005 | Park et al. .................... 438/421 |
| 6,867,125 B2 | 3/2005 | Kloster et al. ................ 438/618 |
| 6,881,437 B2 * | 4/2005 | Ivanov et al. ................ 438/676 |
| 6,943,121 B2 | 9/2005 | Leu et al. ..................... 438/725 |
| 7,179,560 B2 * | 2/2007 | Cho et al. ....................... 429/33 |
| 2003/0148544 A1 * | 8/2003 | Nie et al. ..................... 436/524 |
| 2004/0102031 A1 | 5/2004 | Kloster et al. ................ 438/619 |
| 2004/0170760 A1 | 9/2004 | Meagley et al. ............. 427/248 |
| 2004/0185679 A1 | 9/2004 | Ott et al. ...................... 438/781 |
| 2004/0214427 A1 | 10/2004 | Kloster et al. ................ 438/637 |
| 2004/0229452 A1 | 11/2004 | Johnston et al. ............. 438/622 |
| 2005/0020074 A1 | 1/2005 | Kloster et al. ................ 438/689 |

OTHER PUBLICATIONS

Grant Kloster et al., "Low-K Dielectric Film With Good Mechanical Strength", U.S. Appl. No. 10/217,966, filed Aug. 12, 2002.
Grant Kloster et al., "Selectively Converted Inter-Layer Dielectric", U.S. Appl. No. 10/701,251, filed Nov. 3, 2003.

* cited by examiner

*Primary Examiner*—Elena T Lightfoot
(74) *Attorney, Agent, or Firm*—Kathy Ortiz

(57) ABSTRACT

Method and structure for minimizing the downsides associated with microelectronic device processing adjacent porous dielectric materials are disclosed. In particular, chemical protocols are disclosed wherein porous dielectric materials may besealed by attaching coupling agents to the surfaces of pores. The coupling agents may form all or part of caps on reactive groups in the dielectric surface or may crosslink to seal pores in the dielectric.

4 Claims, 6 Drawing Sheets

SEALING POROUS DIELECTRIC MATERIALS

This is a Divisional Application of Ser. No. 10/735,122 filed Dec. 12, 2003, which is presently pending.

BACKGROUND

1. Field of the Invention

This invention relates to dielectric layers with low dielectric constants, and more particularly to forming barriers across exposed pores in porous low dielectric constant dielectric layers.

2. Background of the Invention

Low dielectric constant ("k") materials are used as interlayer dielectrics in microelectronic devices, such as semiconductor devices, to reduce the resistance-capacitance ("RC") delay and improve device performance. As device sizes continue to shrink, the dielectric constant of the material between metal lines must also decrease to maintain the improvement. Certain low-k materials have been proposed, including various carbon-containing materials such as organic polymers and carbon-doped oxides. The eventual limit for a dielectric constant is k=1, which is the value for a vacuum.

One of the challenges encountered in microelectronic device processing relates to the diffusion of wet chemical and processes gases through dielectric films leading to increased k values (water has a k value of about 80). While pores left in dielectric thin films after certain process steps may be advantageous from a k-value perspective when dry (dry air or nitrogen having relatively low k values), they may also facilitate fast diffusion of unwanted moisture, and may increase surface reactivity with such moisture due to the increased accessible surface area provided by pores, along with possible hydrophilic SiOH formation to propagate such a problem. SiOH available to react near the surface of dielectric pores may result in an increased k value. Pores may also cause additional challenges to subsequent process steps due to geometric considerations. For example, forming a thin sidewall upon a trench cut into a highly porous dielectric material presents obvious challenge—particularly if one of the sides of the trench upon which a sidewall is to be formed lies in the middle of a large pore.

BRIEF DESCRIPTION OF THE DRAWINGS

The present invention is illustrated by way of example and is not limited in the figures of the accompanying drawings, in which like references indicate similar elements. Features shown in the drawings are not intended to be drawn to scale, nor are they intended to be shown in precise positional relationship.

DETAILED DESCRIPTION

In the following detailed description of embodiments of the invention, reference is made to the accompanying drawings in which like references indicate similar elements. The illustrative embodiments described herein are disclosed in sufficient detail to enable those skilled in the art to practice the invention. The following detailed description is therefore not to be taken in a limiting sense, and the scope of the invention is defined only by the appended claims.

Figure 1A:
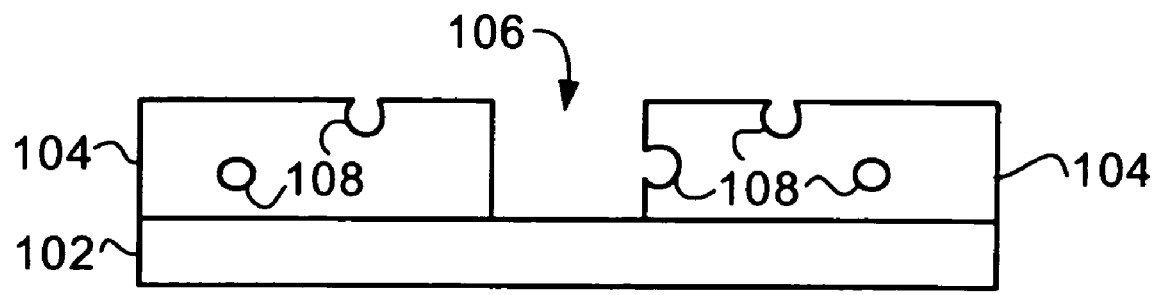
FIGS. 1a and 1b are cross sectional side views of a porous dielectric layer.
Figure 1B:
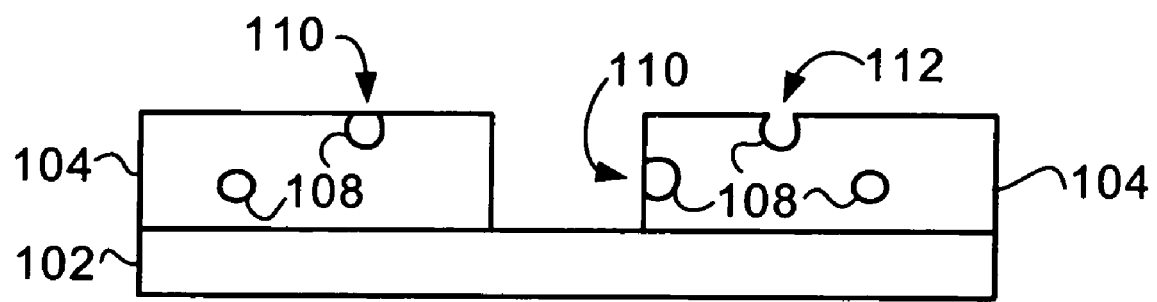

FIGS. 1a and 1b are cross sectional side views of a porous dielectric layer. Referring to FIG. 1a, there is a porous dielectric layer 104 above a substrate layer 102. The porous dielectric layer 104 has pores 108, some of which are within the dielectric layer 104, and some of which are exposed at the surface. In an embodiment, the pores 108 typically have a size ranging from about 20 angstroms to about 100 angstroms, although the pores may also be other sizes. There is also a trench 106 formed in the dielectric layer 104. As shown in FIG. 1a, the pores 108 at the surface of the dielectric layer 104 or at the sidewalls of the trench 108 may have openings that expose the interior of the pores 108 to the surrounding environment. The pores 108 may make it easier for materials in the environment to diffuse into the dielectric material 104, may increase the difficulty of forming thin films on the dielectric layer 104. The porous dielectric material 104 may have reactive groups, such as SiOH groups, near the surface that may cause an increase the dielectric constant ("k") value of the dielectric layer 104.

Referring to FIG. 1b, barriers 110 have been formed over some of the openings of exposed pores 108 at the surface of the dielectric layer 104. These barriers 110 may be considered to "seal" the pore 108 or "seal" the dielectric layer 104 and may prevent problems such as those described above. A pore 112 illustrated in FIG. 1b does not have a barrier formed covering it, but a reaction has caused reactive SiOH groups formerly found near the surface of the dielectric 104 to be capped, which may prevent an increased k value of the dielectric layer 104. Such a capping of SiOH or other reactive chemical structures on the surface of the dielectric 104 may also be considered as a "sealing" of the pore 108 or a "sealing" of the dielectric 104.

Figure 2:
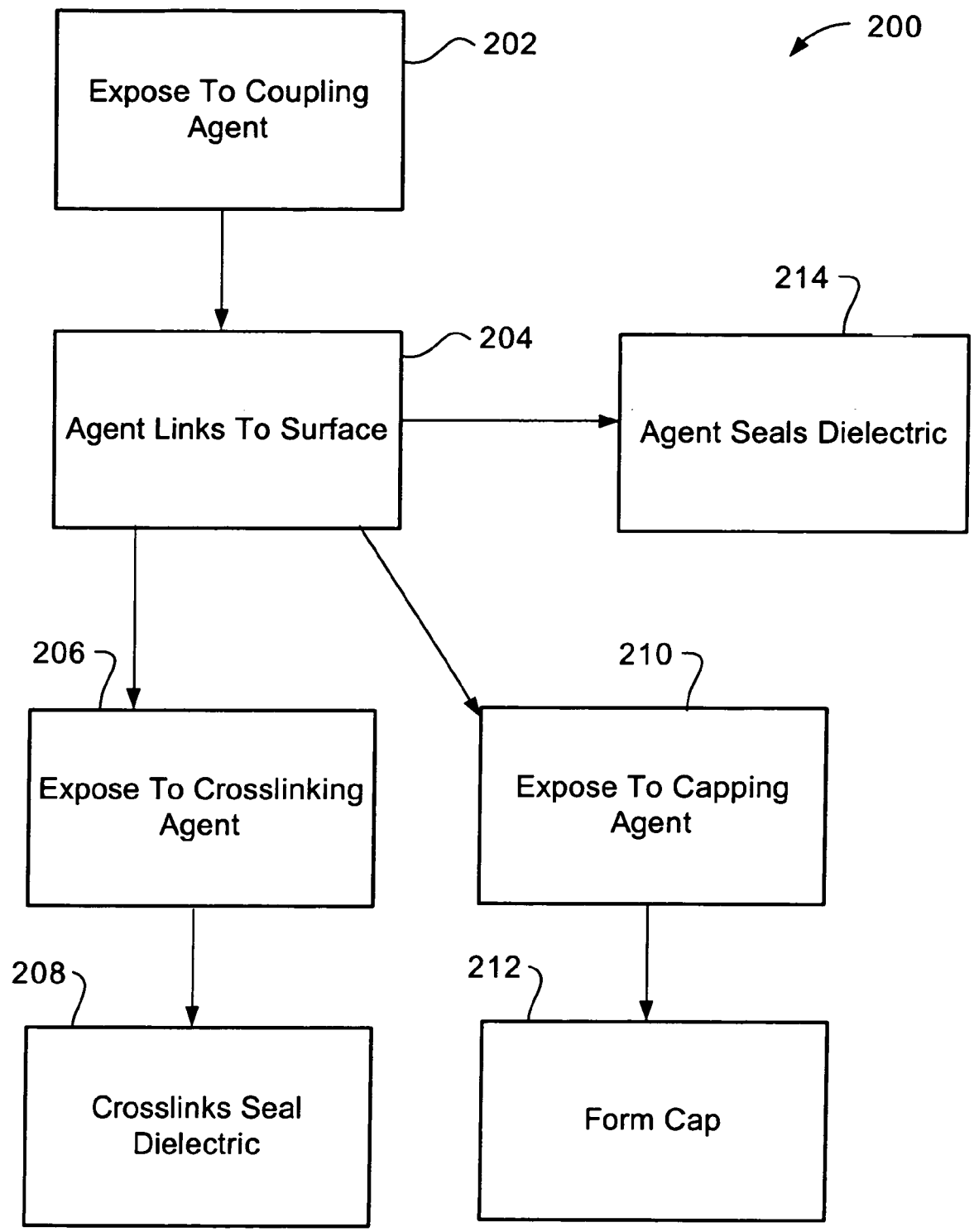
FIG. 2 is a flow chart that describes how porous dielectric may be sealed.

FIG. 2 is a flow chart 200 that describes various ways that a porous dielectric, such as dielectric 104, may be sealed according to some embodiments of the present invention. This sealing may include capping reactive chemical structures, such as SiOH groups, of the dielectric material. The sealing may include forming barriers 110 over exposed pores 108. To seal the dielectric 104, the dielectric 104 may be exposed 202 to a coupling agent. The coupling agent may then link 204 to the dielectric 104 surface. This linking may result from a reaction between the coupling agent and chemical groups at the dielectric 104 surface to form a coupling structure attached to the dielectric 104 surface.

In a first sealing embodiment, the coupling agent and the dielectric 104 may be exposed 206 to a crosslinking agent. This crosslinking agent exposure 206 may cause the coupling agent or coupling structure attached to the dielectric 104 to crosslink in a reaction. Such crosslinks may seal 208 the dielectric 104. This seal 208 may result from crosslinking that form barriers to prevent external material from penetrating the pores 108, or crosslinked groups capping reactive groups on the surface of the dielectric 104.

In a second sealing embodiment, the coupling agent and the dielectric 104 may be exposed 210 to a capping agent. This capping agent exposure 210 may cause the coupling agent or coupling structure attached to the dielectric 104 to react to form 212 a cap structure to seal the dielectric 104. Note that both a crosslinking agent and a capping agent may be referred to as a "sealing agent."

In a third sealing embodiment, the coupling agent may seal 214 the dielectric 104 without additional capping or crosslinking agents. The coupling agent may react with the surface of the dielectric 104 to form a cap to seal the dielectric 104. Alternatively, coupling structures linked 204 to the dielectric 104 surface may crosslink with other coupling structures linked 204 to the dielectric 104 to form a barrier and seal 214 the dielectric 104. This seal 214 may result from crosslinks that form barriers to prevent external material from penetrating the pores 108, or from crosslinked groups or capped groups that cap reactive groups on the surface of the dielectric 104.

In other embodiments, the dielectric 104 may be sealed using multiple ones of the first through third embodiments, or may be sealed through other methods. For example, in a fourth sealing embodiment, the dielectric 104 may be exposed 202 to a coupling agent that may form coupling structures linked 204 to a pore 108 surface. Some coupling structures may partially seal 214 the pore 108 by crosslinking or other processes, without being exposed to a crosslinking or other agent. Other coupling structures may crosslink in response to being exposed 206 to a crosslinking agent, and form 208 a barrier to seal the pore 108, or cap reactive groups on the pore 108 surface. Other coupling structures may alternatively form 212 a cap structure in response to being exposed 210 to a capping agent. Thus, in the fourth sealing embodiment, the dielectric 104 may be sealed partially via the first or second sealing embodiments and partially via the third sealing embodiments. Other embodiments of sealing a dielectric material 104 by capping or crosslinking may also be used.

In some embodiments, a cleaning step (not shown) may also be performed. In such a cleaning step, products of chemical reactions, excess coupling or crosslinking agents, or other substances may be removed from the vicinity of the dielectric 104. This may be accomplished by a flow of gas or fluid removing the substances, causing a reaction of the substances with another material to result in an acceptable result material, or by other methods. Other additional steps may also be performed in some embodiments.

Figure 3A:
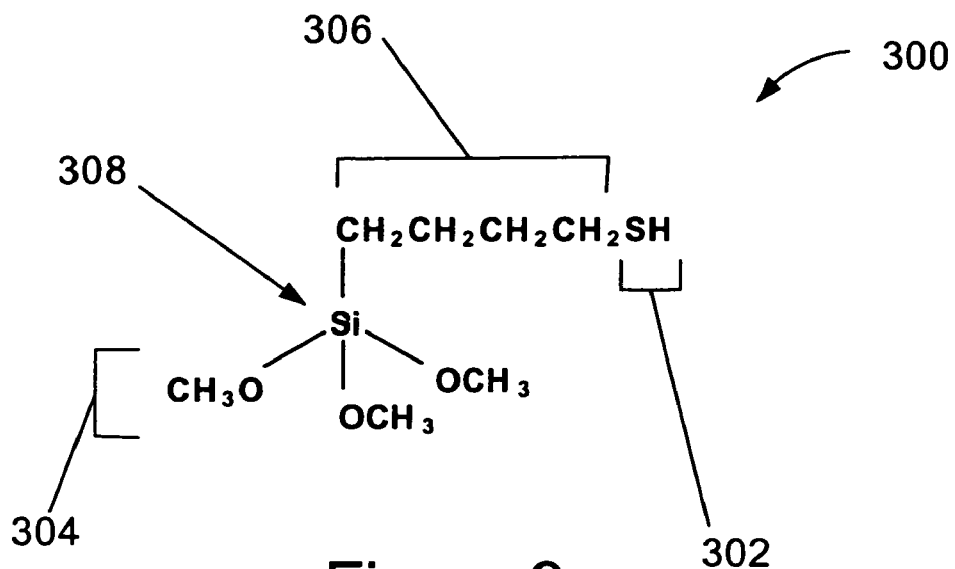
FIG. 3a is an illustration of a coupling agent used according to one embodiment.
Figure 3B:
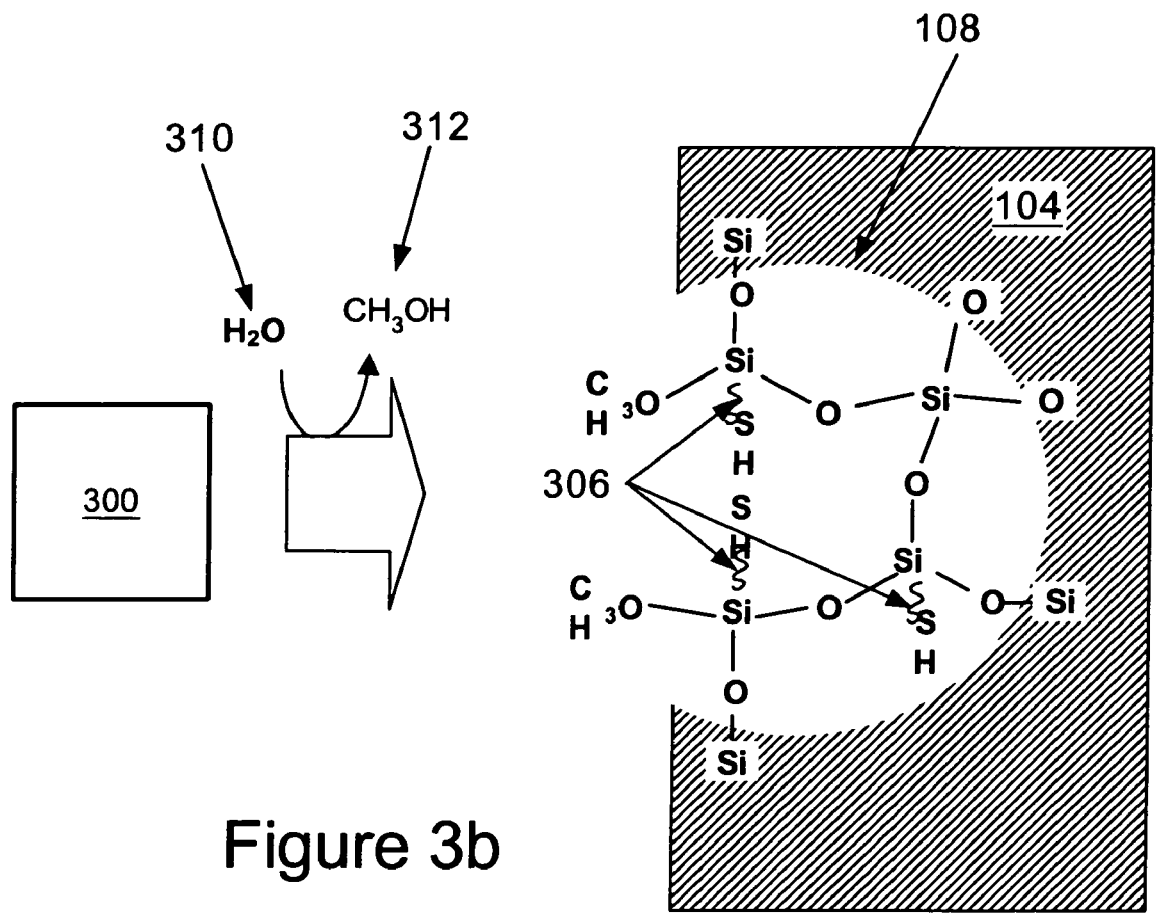
FIG. 3b illustrates the linkage of the coupling agent to the pore surface.
Figure 3C:
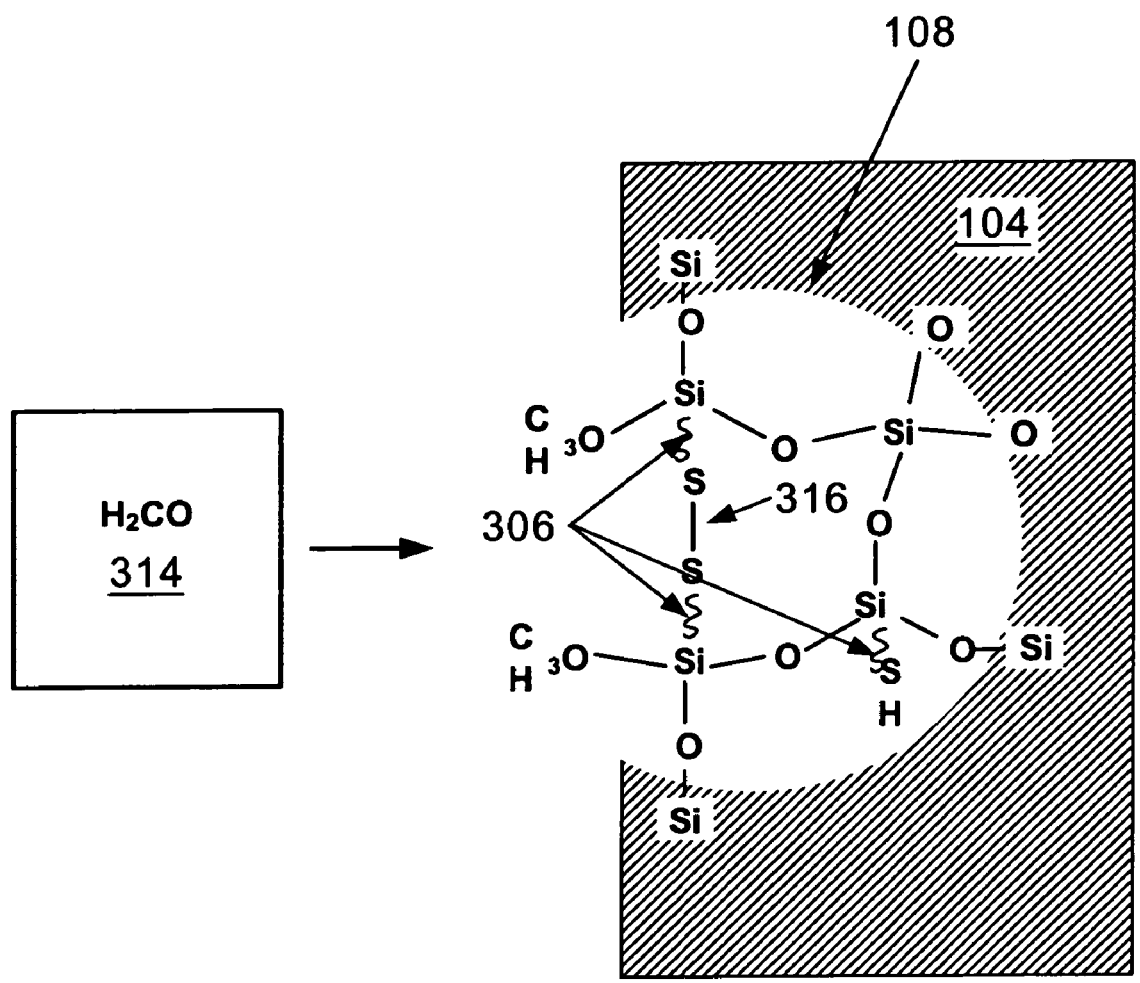
FIG. 3c illustrates the formation of the barrier across the opening of the pore.

FIGS. 3a through 3c illustrate how porous dielectric material 104 may be sealed according to an example of the first sealing embodiment described above with respect to FIG. 2. FIG. 3a is an illustration of a coupling agent 300 to which a pore 108 in the dielectric 104 may be exposed 202 in one embodiment. The coupling agent 300 depicted in FIG. 3a is a silane coupling reagent 300 with a thiol ("SH") termini or "end cap" 302 that may facilitate disulfide bonding to seal an exposed pore 108. The silane coupling reagent 300 is depicted with the thiol end cap 302 comprising a sulfur atom that may form one half of a disulfide bond at the end of the chemical progression. The thiol end cap 302 may be coupled to a silicon atom 308 by a chain 306 of $CH_2$ moieties. The length of the chain 306 may be selected to facilitate micromotion of the thiol end cap 302 for sulfur-sulfur ("disulfide") bonding. In other words, the chain of $CH_2$ moieties may provide a relatively "floppy" construct to allow the thiol end cap 302 freedom to move into electrical contact with another nearby thiol end cap 302, enabling formation of a disulfide bond. Such a floppy construct may be known as a flexible chain. In some embodiments, the chain 306 may be relatively long. In an embodiment, the chain 306 may have 4 $CH_2$ moieties, and in some other embodiments, the chain 306 may have from about 3 to about 5 $CH_2$ moieties.

The depicted embodiment of the silane coupling reagent 300 also comprises three surface coupling groups 304 selected to react with SiOH groups or other groups that might be found on the surface of a silicate glass pore 108. These surface coupling groups 304 need not be the exact $OCH_3$ (or $CH_3O$) groups depicted—indeed, they may be referred to as "alkoxy," "ether," or "alkoxides" to one skilled in the art. For example, anywhere from one to three ethoxy groups would work to reactively link with the surface chemistry at the pore 108 in an embodiment. Other reagent surface coupling groups, including but not limited to those known as tert-butoxy and isopropoxy, may be substituted into the silane coupling reagent 300 as surface coupling groups 304. In an embodiment, the alkoxy (oxygen) groups support pore surface reaction.

Referring now to FIG. 3b, the linking 204 of the coupling agent 300 to the pore 108 surface is illustrated according to one embodiment. In an embodiment, the material 104 may be exposed to nitrogen or helium gas containing the coupling agent 300 at a concentration below the coupling agent's 300 lower flammability limit and at a temperature just below the flash point of the coupling agent 300. As the silane coupling agent 300 is introduced, nearby water 310 may react with the surface coupling groups 304, $OCH_3$ in this embodiment, to form methanol ("$CH_3OH$") 312. The methanol 312 may readily evaporate or may be vented away. This results in SiOH groups (not shown) that react with other SiOH groups already hanging off the surface of the pore 108 to form "Si—O—Si" linkages, as depicted in FIG. 3b. The silicon atom 308 is therefore coupled to the surface of the pore 108. Thus, the reaction of the coupling agent 300 has resulted in a coupling structure linked 204 to the surface of the pore 108.

Additional water produced by such reactions (not shown) may help to propagate more of these reactions by facilitating production of more SiOH groups, and eventually the pore 108 may be substantially occupied by variations of the silane coupling reagent 300 bonded to the surface of the pore 108. As the pore 108 may be substantially occupied by the coupling reagent 300 bonded to the surface of the pore 108, this may have resulted in the capping of the SiOH groups and a sealed pore.

Pore 108 sizes may generally be on the order of 20-100 angstroms in some porous dielectric materials used to form the dielectric layer 104. Silane coupling reagents 300 such as that depicted may have molecular radii of about 3 angstroms. For a pore 108 size of about 20-100 angstroms, therefore, about 6-30 molecules of the silane coupling agent 300 may be adequate to link 204 with the pore 108 surface and form a barrier for the pore 108 that may prevent external material from penetrating into the pore 108.

To form a barrier, the linked coupling agent 300 and pore 108 may be exposed 206 to a crosslinking agent 314. In an embodiment, the crosslinking agent 314 may be a mild oxidizing agent 314, such as formaldehyde ("$H_2CO$"). In an embodiment, this exposure 206 may occur when the pore 108 is substantially covered with linked 204 coupling agent 300 molecules. The oxidizing agent 314 may be selected to be strong enough to oxidize the "SH" bonds of the thiol end caps 302 without substantially oxidizing other adjacent sensitive materials, such as copper, in an embodiment. In an embodiment, the pore 108 may be exposed to nitrogen or helium gas containing formaldehyde gas as the crosslinking agent 314, at a concentration below formaldehyde's lower flammability limit, and at a temperature just below formaldehyde's flash point. In an embodiment, the concentration may be below about 7% formaldehyde, and the temperature may be below about 59 degrees Celsius.

FIG. 3c illustrates sealing 208 the dielectric 104 pore 108 by formation of a barrier across the opening of the exposed pore 108 according to one embodiment. The crosslinking agent 314 may oxidize the "SH" bonds of the thiol end caps 302 of the linked 204 coupling agent 300 molecules. This enables the sulfur atoms in the end caps 302 to fulfill their bonding capabilities and form a disulfide bond 316 by pairing with another sulfur atom missing an electron. This bond may result in a "bridge" structure of multiple coupled barrier molecules, which may each include a silicon atom 308, a flexible chain 306, and a sulfur atom. The resultant "bridge" structure across the pore 108 may substantially fill the pore opening, creating a barrier 110 to the pore 108. The bridge structure may be crosslinked to have enough density to act as a physical barrier to other chemicals getting through as a result of subsequent process treatments of the dielectric layer 104. Thus, the exposed pore 108 has been sealed. In some embodiments, the crosslinking may not result in a bridge that substantially fills the opening of the pore 108. The dielectric 104 may still be sealed, since the crosslinked structures may effectively cap reactive groups, such as SiOH groups, at the surface of the dielectric.

Optionally in some embodiments, the structure may be made more hydrophobic by introducing, for example, hexamethyldisilazane ("HMDS") or other chemicals. Such a process would further prevent pore reactivity or formation of further SiOH. HMDS forms strong surface bonds, which creates a locally hydrophobic environment.

Figure 4A:
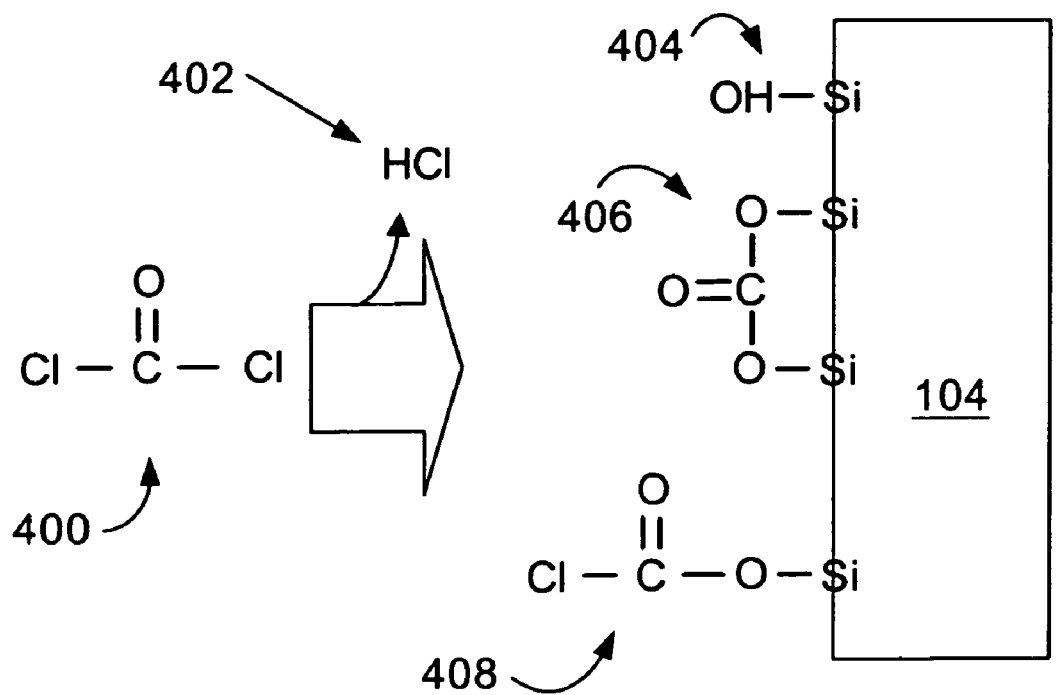
FIG. 4a illustrates the dielectric exposed to a coupling agent and the results of various reactions that may occur.
Figure 4B:
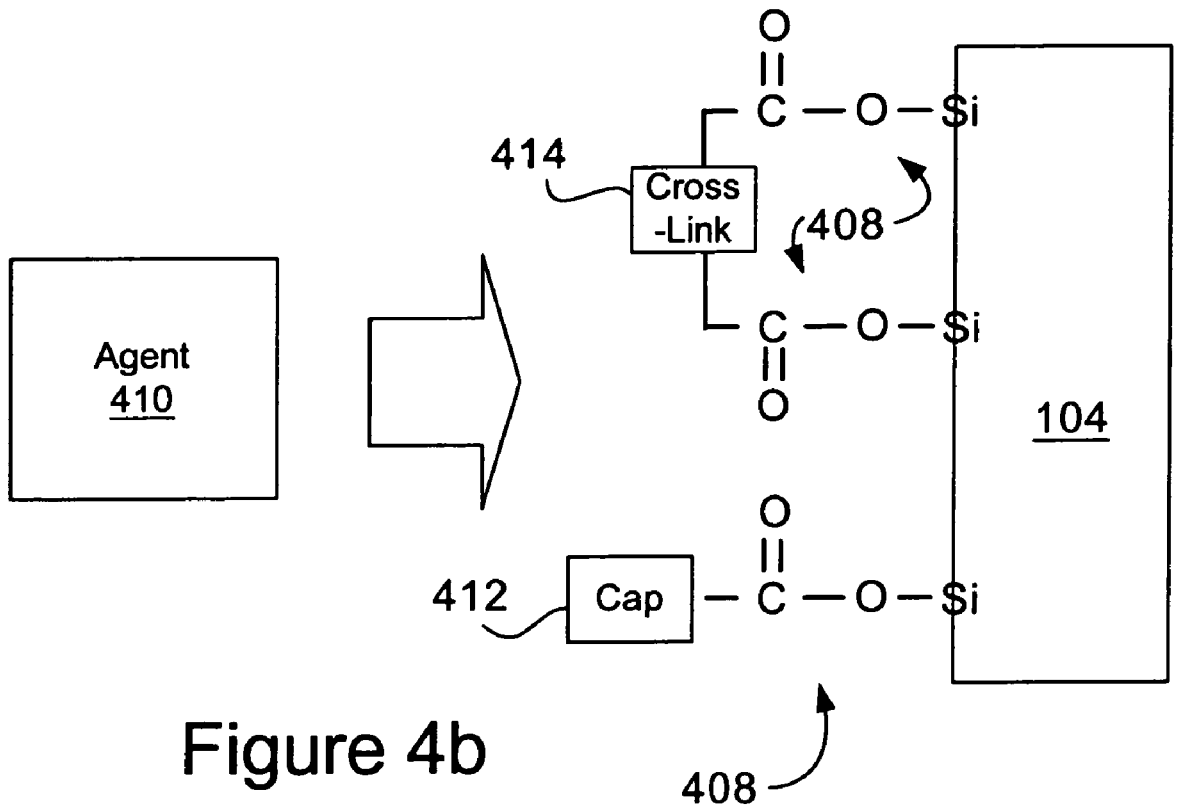
FIG. 4b illustrates exposure of coupling structures to an additional sealing agent.

FIGS. 4a and 4b illustrate how the dielectric 104 may be sealed according to another example of the first sealing embodiment described above with respect to FIG. 2, according to an example of the second sealing embodiment described above with respect to FIG. 2, and according to an example of the third sealing embodiment described above with respect to FIG. 2.

FIG. 4a illustrates the dielectric 104 exposed 202 to a coupling agent and the results of various reactions that may occur. In the embodiment illustrated in FIG. 4a, the coupling agent 400 is phosgene, which may be present in a vapor form. Note that care should be taken when using phosgene. Even brief exposures to phosgene at a concentration above 50 ppm may be fatal to humans. The dielectric 104 may have reactive SiOH groups 404 at the surface. In an embodiment, phosgene may be introduced in a vapor phase at a temperature in a range from about zero degrees Celsius to about 50 degrees Celsius at a concentration of about 5 ppm to about 1%. The phosgene coupling agent 400 may react with the SiOH groups 404. This reaction may result in HCl 402, and the phosgene 400 linking 204 to the surface of the dielectric 104, which may be in a pore 108. The linked 204 phosgene 400 may result in a pendant phosgene functional group 408, which may be considered a coupling structure, linked 204 to the pore 108 or dielectric 104 surface. Nearby coupling structures may react to form disilyl carbonate 406. The disilyl carbonate 406 may seal 214 the pore 108, and may comprise an example of the third sealing embodiment described above with respect to FIG. 2a. The disilyl carbonate 406 may seal the dielectric 104 by forming a pore 108 barrier 110 to prevent external material from penetrating the pores 108, and/or by capping reactive groups on the surface of the dielectric 104.

FIG. 4b illustrates exposure of coupling structures, such as the pendant phosgene functional groups 408, to an additional sealing agent 410. The agent 410 may be either or both of a crosslinking or capping agent, so that the coupling agent structures may be exposed 206 to a crosslinking agent according to the first sealing embodiment described above with respect to FIG. 2 and/or exposed 210 to a capping agent according to an example of the second sealing embodiment described above with respect to FIG. 2. Both a crosslinking agent and a capping agent may be considered "sealing agents" 410.

In an embodiment, the agent 410 may be a crosslinking agent such as a multifunctional alcohol. Examples of such a multifunctional alcohol may include ethylene glycol, propylene glycol, glycerol, erythritol, and pentaerythritol. The alcohol may be in a vapor form. These crosslinking agents may react to attach to the coupling structures 408, then may form crosslinks 414 to connect two or more coupling structures 408. In an embodiment where one desires to seal exposed surfaces of the material 104, the sealing agent 410 may be introduced as a liquid or in a solvent at a temperature in a range from about zero degrees Celsius to about 100 degrees Celsius at a concentration of about 0.1% to about 100% (liquid state). In an embodiment where one desires the sealant to penetrate further into the material 104, the sealing agent 410 may be introduced as a solution in a supercritical fluid at a concentration of about 0.1% to about 100% or in a vapor phase at a temperature in a range from about 100 degrees Celsius to about 300 degrees Celsius at a concentration of about 5 ppm to about 5%. Such crosslinking may effectively seal 208 the dielectric 104 by removing reactive SiOH groups at the surface of the dielectric 104 and/or forming a barrier to prevent external material from penetrating the pore 108.

In another embodiment, the agent 410 may be a capping agent such as a monofunctional alcohol. Such a monofunctional alcohol may be methanol. The alcohol may be in a vapor form. In an embodiment, a methanol capping agent may be introduced as a liquid or in a solvent at a temperature in a range from about zero degrees Celsius to about 50 degrees Celsius at a concentration of about 0.1% to about 100% (liquid state). In an embodiment where one desires the sealant to penetrate further into the material 104, the methanol capping agent may be introduced as a solution in a supercritical fluid at a concentration of about 0.1% to about 100% or in a vapor phase at a temperature in a range from about 50 degrees Celsius to about 100 degrees Celsius at a concentration of about 5 ppm to about 5%. The capping agent 410 may react to attach to the coupling structures 408 and form 212 a cap 412 on them. For example, when methanol is used as a capping agent, the methanol may react to a coupling structure 408 to form mehtyl silyl carbonate, which may seal the pore 108 or dielectric 104.

Figure 5:
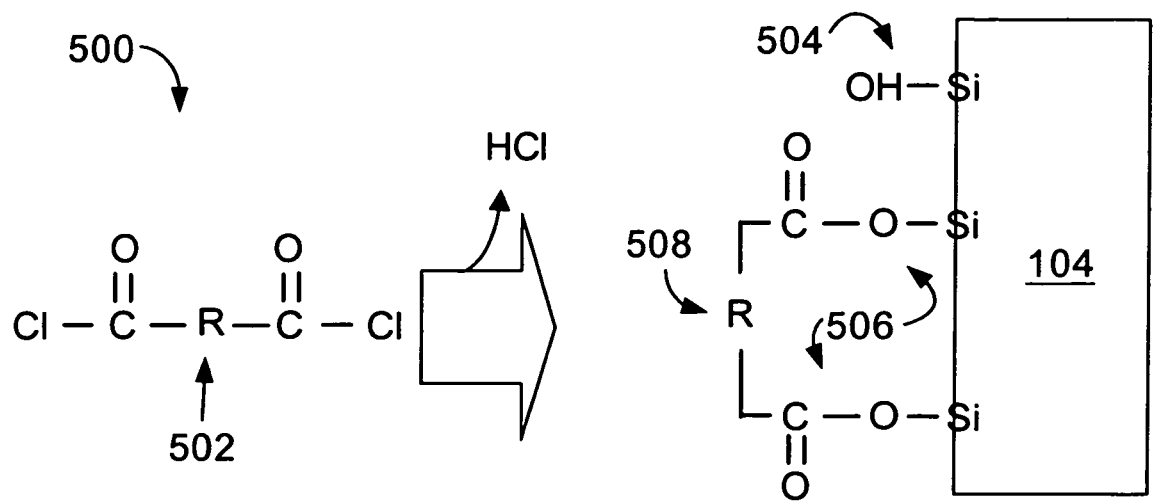
FIG. 5 illustrates another example of how a porous dielectric may be sealed.

FIG. 5 illustrates how dielectric 104 or pores 108 may be sealed according to an example of the third sealing embodiment described above with respect to FIG. 2. The dielectric 104 may be exposed 202 to a coupling agent 500. The coupling agent 500 may be an acyl dichloride, such as succinyl chloride, and may include one or more R groups 502 that may react to form crosslinks. The R group 502 may be different for different coupling agents 500. For example, in an embodiment where the coupling agent 500 is succinyl chloride, the R group 502 may be $CH_2CH_2$. In an embodiment where succinyl chloride acts as a coupling agent 500, the succinyl chloride may be in a solution of a supercritical fluid at a temperature in a range from about zero degrees Celsius to about 100 degrees Celsius. The coupling agent 500 may both link 204 to the dielectric surface 104 and crosslink to seal 214 the pore. The dielectric 104 may have reactive SiOH groups 504 at the surface. The coupling agent 500 may react with the SiOH groups 504 to form coupling structures 506 linked to the dielectric 104 surface, and crosslinking groups 502 of the structures 506 may react to form a crosslink 508. Such crosslinked structures 506 may seal 214 the dielectric 104. Such crosslinking may effectively seal 214 the dielectric 104 by removing reactive groups at the surface of the dielectric 104 and/or forming a barrier to prevent external material from penetrating the pore 108.

Figure 6:
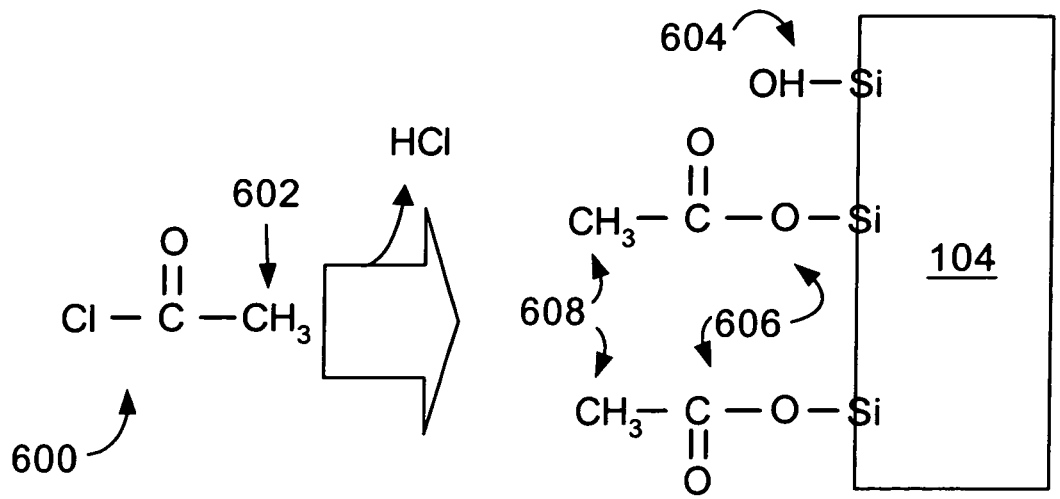
FIG. 6 illustrates yet another example of how a porous dielectric may be sealed.

FIG. 6 illustrates how dielectric 104 or pores 108 may be sealed according to another example of the third sealing embodiment described above with respect to FIG. 2. The dielectric 104 may be exposed 202 to a coupling agent 600. The coupling agent 600 may be an acyl chloride, such as acetyl chloride, and may include a capping group 602. The coupling agent 600 may be introduced under conditions similar to those described above with respect to the sealing agent 410. The coupling agent 600 may link 204 the dielectric surface 104. The dielectric 104 may have reactive SiOH groups 604 at the surface. The coupling agent 600 may react with the SiOH groups 604 to form structures 606 linked to the dielectric 104 surface. The capping groups 602 may comprise caps 608 to seal 214 the dielectric 104.

In the embodiments described above, larger coupling agents with more crosslinking groups may be used to increase the crosslinking density and form a pore 108 barrier 110 to prevent external material from penetrating the pores 108. Smaller coupling agents with fewer functional crosslinking groups may be used to cap reactive groups on the surface of the dielectric 104. Further, the depth of the sealing into the dielectric 104 may be controlled by the time which the dielectric 104 may be exposed to coupling agents. A smaller exposure time may result in sealing the surface of dielectric 104 and pores 108 near the surface, while a larger exposure time may result in sealing the surface of pores 108 deeper within the dielectric material.

Thus, a novel pore sealing solution is disclosed. Although the invention is described herein with reference to specific embodiments, many modifications therein will readily occur to those of ordinary skill in the art. Accordingly, all such variations and modifications are included within the intended scope of the invention as defined by the following claims.

We claim:

1. A device comprising:
a substrate layer,
a porous dielectric layer adjacent the substrate layer with an exposed pore having an opening, wherein the exposed pore is disposed on at least one of a surface of the porous dielectric layer and a sidewall of a trench disposed within the porous dielectric layer; and
a barrier across the opening of the exposed pore, wherein the barrier comprises a first barrier molecule with a silicon atom coupled to a surface of one side of the exposed pore, a sulfur atom, and a flexible chain between the silicon atom and the sulfur atom, wherein the flexible chain comprises a portion of a bridge structure that is capable of sealing the surface of the exposed pore, and a second barrier molecule with a silicon atom coupled to a surface of an opposite side of the exposed pore, wherein the first and second barrier molecules are connected to each other across the surface of the exposed pore.

2. The device of claim 1 wherein the flexible chain comprises a substantially long chain of $CH_2$ groups.

3. The device of claim 2 wherein the substantially long chain of $CH_2$ groups comprises at least four $CH_2$ groups.

4. The device of claim 1 wherein the exposed pore is in a range from about 20 angstroms to about 100 angstroms, and the barrier comprises about 6 to about 30 crosslinked barrier molecules.

* * * * *